United States Patent [19]
Ikeda et al.

[11] Patent Number: 5,989,342
[45] Date of Patent: Nov. 23, 1999

[54] APPARATUS FOR SUBSTRATE HOLDING

[75] Inventors: Masahide Ikeda; Masami Ohtani, both of Kyoto, Japan

[73] Assignee: Dainippon Screen Mfg, Co., Ltd., Japan

[21] Appl. No.: 08/789,764

[22] Filed: Jan. 28, 1997

[30] Foreign Application Priority Data

Jan. 30, 1996 [JP] Japan .................................. 8-014446

[51] Int. Cl.⁶ .................................................. B05C 13/00
[52] U.S. Cl. .............................. 118/52; 118/56; 118/500; 118/501; 118/503; 118/319; 118/320; 118/730; 269/8; 269/231; 269/235; 134/902; 156/345; 414/225.01; 414/935; 414/941; 432/253
[58] Field of Search ................................ 118/52, 56, 500, 118/501, 503, 319, 320, 730; 269/8, 235, 231, 305, 903; 134/902; 156/345; 414/225.01, 935, 941; 432/235; 15/268; 901/40, 43

[56] References Cited

U.S. PATENT DOCUMENTS 5,376,216  12/1994  Yoshioka et al. ........................ 156/345

*Primary Examiner*—Laura Edwards
*Attorney, Agent, or Firm*—Ostrolenk, Faber, Gerb & Soffen, LLP

[57] ABSTRACT

A substrate holding apparatus holds a rotating substrate without idly rotating the substrate and keeps the substrate in proper balance while the substrate is rotated. In a revolvable holding member, a column-shaped holding part is disposed on a top surface of a column-shaped supporting part, at an eccentric position with respect to a rotation axis of the supporting part. The revolvable holding member is supported by a rotation base for free rotation, and linked to a magnet holding part which incorporates a permanent magnet. On the other hand, a ring-shaped magnet which is disposed in a processing liquid collecting cup is freely driven by an air cylinder in a vertical direction. As the ring-shaped magnet is moved upward or downward and crosses a predetermined line as viewed in a positional relationship relative to the permanent magnet, which is at a height where the permanent magnet is disposed, the direction of a magnetic line of flux of the ring-shaped magnet is reversed. As a result, the direction of the revolving force which acts upon the permanent magnet is reversed, whereby the revolvable holding member holds or releases a substrate.

22 Claims, 15 Drawing Sheets

APPARATUS FOR SUBSTRATE HOLDING

BACKGROUND OF THE INVENTION

1. Field of the Invention

The present invention relates to a substrate holding apparatus which is applied to a substrate processing apparatus such as a semiconductor manufacturing apparatus (e.g., a rotation type substrate processing apparatus, a substrate transporting apparatus).

2. Description of the Prior Art

In a rotation type substrate processing apparatus (such as a rotation type coating apparatus and a rotation type developing apparatus) for processing a semiconductor wafer, a liquid crystal glass substrate and the like (hereinafter "substrate(s)"), while rotating a substrate, it is necessary to suppress slipping between the substrate and a member which holds the substrate as much as possible. As the substrate is chipped away at a surface if slipping occurs, not only the substrate is damaged but also dust is created, which in turn deteriorates the cleanness. Further, as processing liquid does not flow uniformly, the quality of processing of the substrate is degraded. Hence, the following technique which suppresses slipping of the substrate has been conventionally provided.

FIG. 18 shows a conventional substrate holding apparatus 900. A plurality of substrate holding members 902 which are disposed on a top surface of a rotation stage 901 are obtained by forming substrate holding parts 903 and horizontal position restricting parts 904 integral with each other. As a top surface of the substrate holding part 903 touches an outer peripheral portion of a bottom surface of a substrate W, the substrate W is held horizontally with a distance from the rotation stage 901. Side surfaces of the horizontal position restricting parts 904 touch an outer peripheral portion Wa of the substrate W and accordingly restrict the position of the substrate W on a horizontal plane. Further, a substrate pressing member 911, which is supported by a fixedly disposed revolvable bearing member 912 so as to be freely rotatable within a vertical plane along a radial direction of the rotation stage 901, is disposed to a peripheral portion of the top surface of the rotation stage 901.

A ring-shaped magnet 920 is disposed to an internal bottom surface of a processing liquid collecting cup 908. The ring-shaped magnet 920 is a permanent magnet which is located below the rotation stage 901, and is formed in a periphery-like configuration which resembles a rotation locus about a rotation axis A of the rotation stage 901. An N-pole is created in a top surface of the ring-shaped magnet 920 while an S-pole is created in a bottom surface of the ring-shaped magnet 920, for example.

The substrate pressing member 911 internally includes a permanent magnet 913. As to the polarities of the permanent magnet 913, an S-pole is created on a pressing surface 911a side and an N-pole is created on one end 911b side. The center of gravity G of the substrate pressing member 911 is located outwardly shifted off a supporting point 912a of the revolvable bearing member 912 (i.e., between the supporting point 912a and the one end 911b). The ring-shaped magnet 920 is moved vertically together with the processing liquid collecting cup 908, toward close to or away from the one end 911b of the substrate pressing member 911.

Prior to and after processing of the substrate W, the processing liquid collecting cup 908 is located at a low position (which is indicated by the dotted line in FIG. 18) while the ring-shaped magnet 920 is away from the one end 911b. Hence, the permanent magnet 913 of the substrate pressing member 911 is rarely subjected to magnetic force of the ring-shaped magnet 920. At this stage, since the center of gravity G is outwardly shifted off the supporting point 912a, the substrate pressing member 911 is in such a posture which releases the substrate W (i.e., the posture shown by the dotted line in FIG. 18).

On the other hand, when the substrate W is processed, the processing liquid collecting cup 908 is moved upward and kept at a position which is indicated by the solid line in FIG. 18. At this stage, the ring-shaped magnet 920 is moved close to the substrate pressing member 911, thereby causing the N-pole of the ring-shaped magnet 920 and the N-pole of the permanent magnet 913 to exert magnetic repulsion to each other. As a result, the substrate pressing member 911 revolves about the supporting point 912a and takes the posture which is shown by the solid line in FIG. 18, whereby the pressing surface 911a is brought into contact with and urged against the outer peripheral portion Wa of the substrate W. Thus, the urging force tightly holds the substrate W between the pressing surface 911a and the side surfaces of the plurality of horizontal position restricting parts 904.

In such a structure as described above, since the ring-shaped magnet 920 is disposed along the rotation locus about the rotation axis A, the substrate W is always subjected to applied urging force while processed. This makes it possible to hold the substrate W while rotating the substrate W throughout the entire period of processing, without idly rotating the substrate W. Further, it is possible to release the substrate W only by moving the processing liquid collecting cup 908 downward.

However, since the conventional substrate holding apparatus 900 described above which is applied to a rotation type substrate processing apparatus requires that the center of gravity G is outwardly shifted off the supporting point 912a, a portion of the substrate pressing member 911 which is outward to the supporting point 912a becomes large and therefore it is difficult to take balance while rotating. This in turn adversely affects the quality of processing of the substrate.

Further, while the substrate holding apparatus 900 described above is applied to a rotation type substrate processing apparatus, such a substrate holding apparatus should allow application to various types of apparatuses which handle substrates (e.g., a substrate transporting apparatus).

In a substrate transporting apparatus, particularly when a substrate having a large diameter is to be handled, it is necessary to transport the substrate as it is inclined at an angle for the purpose of reducing a transportation space. However, in the substrate holding apparatus 900 described above, as the center of gravity G is located outward to the supporting point 912a of the substrate pressing member 911, that is, as the substrate W is released utilizing the gravity force which acts upon the substrate pressing member 911, if the substrate W is inclined at an angle, depending on a positional relationship between the center of gravity G and the supporting point 912a, it may become impossible to release the substrate W any more. Although the gravity force may be replaced with external force such as urging force which is created by a spring in order to release the substrate W which is inclined at an angle, such will make the structure of the substrate pressing part complex.

SUMMARY OF THE INVENTION

The present invention is directed to an apparatus for holding a substrate, which is used in a unit for processing the substrate with rotating the substrate.

According to the present invention, the apparatus comprises: a) a rotational stage for rotating around a first axis; b) fixed holding means for restricting a position of the substrate by being in contact with an edge of the substrate, the fixed holding means being fixed on the rotational stage; c) movable holding means for holding the substrate, the movable holding means being movably supported on the rotational stage and connected with first magnetic means; d) second magnetic means for generating a magnetic field and applying the magnetic field to the first magnetic means, the second magnetic means being arranged outside of the rotational stage; and e) inversion means for inverting direction of the magnetic field at the first magnetic means; wherein the movable holding means is capable of holding the substrate in contact with the edge of the substrate and releasing the substrate in response to inversion of the direction of the magnetic field.

Since magnetic force acts upon the first magnetic means which is attached to the movable holding means to hold a substrate, it is possible to hold the substrate which is rotated without causing idle rotation of the substrate. Further, since the inversion means is disposed, it is possible to reverse the direction of a magnetic line of flux which acts upon the magnetic means which is attached to the movable holding means. Since a substrate is released by means of reversing of the direction of the magnetic line of flux, it is not necessary to consider the position of the center of gravity of the movable holding means, and therefore, the substrate is kept in excellent balance while rotated.

In a preferred embodiment of the present invention, the second magnetic means comprises d-1) circular magnet whose center being on the first axis, and the inversion means comprises e-1) moving means for moving the circular magnet along the first axis, the moving means being capable of inverting the direction of the magnetic field in response to movement of the circular magnet across a predetermined line which is determined in connection with a relative position between the first magnetic means and the circular magnet.

In another preferred embodiment of the present invention, the movable holding means includes a rotatable holding member comprising c-1) a rotatable base provided on the rotational stage, the rotatable base being capable of rotating around a second axis with the first magnetic means in response to inversion of the direction of the magnetic field, and c-2) a substrate holding member coupled to the rotatable base, the substrate holding member including convex curved surface which is capable of holding the substrate in contact with the edge of the substrate and releasing the substrate with rotation of the rotatable base.

In another preferred embodiment of the present invention, the movable holding means comprises a slide holding member comprising c-1) a slide base provided on the rotational stage and capable of moving along radial of the rotational stage with movement of the first magnetic means in response to inversion of the direction of the magnetic field, and c-2) a substrate holding member provided on the slide base and capable of holding the substrate in contact with the edge of the substrate and releasing the substrate in response to movement of the slide base.

The present invention is also directed to a method of processing a substrate.

Accordingly, an object of the present invention is to hold a substrate which is rotated without causing idle rotation of the substrate, while keeping excellent balance.

Another object of the present invention is to provide for a substrate holding apparatus which, with a simple structure, holds and releases a substrate even if the substrate is inclined at an angle.

These and other objects, features, aspects and advantages of the present invention will become more apparent from the following detailed description of the present invention when taken in conjunction with the accompanying drawings.

DESCRIPTION OF THE PREFERRED EMBODIMENTS

Now, a preferred embodiment of the present invention will be described in detail with reference to the associated drawings.

A-1. Structure of Substrate Processing Unit

Figure 1:
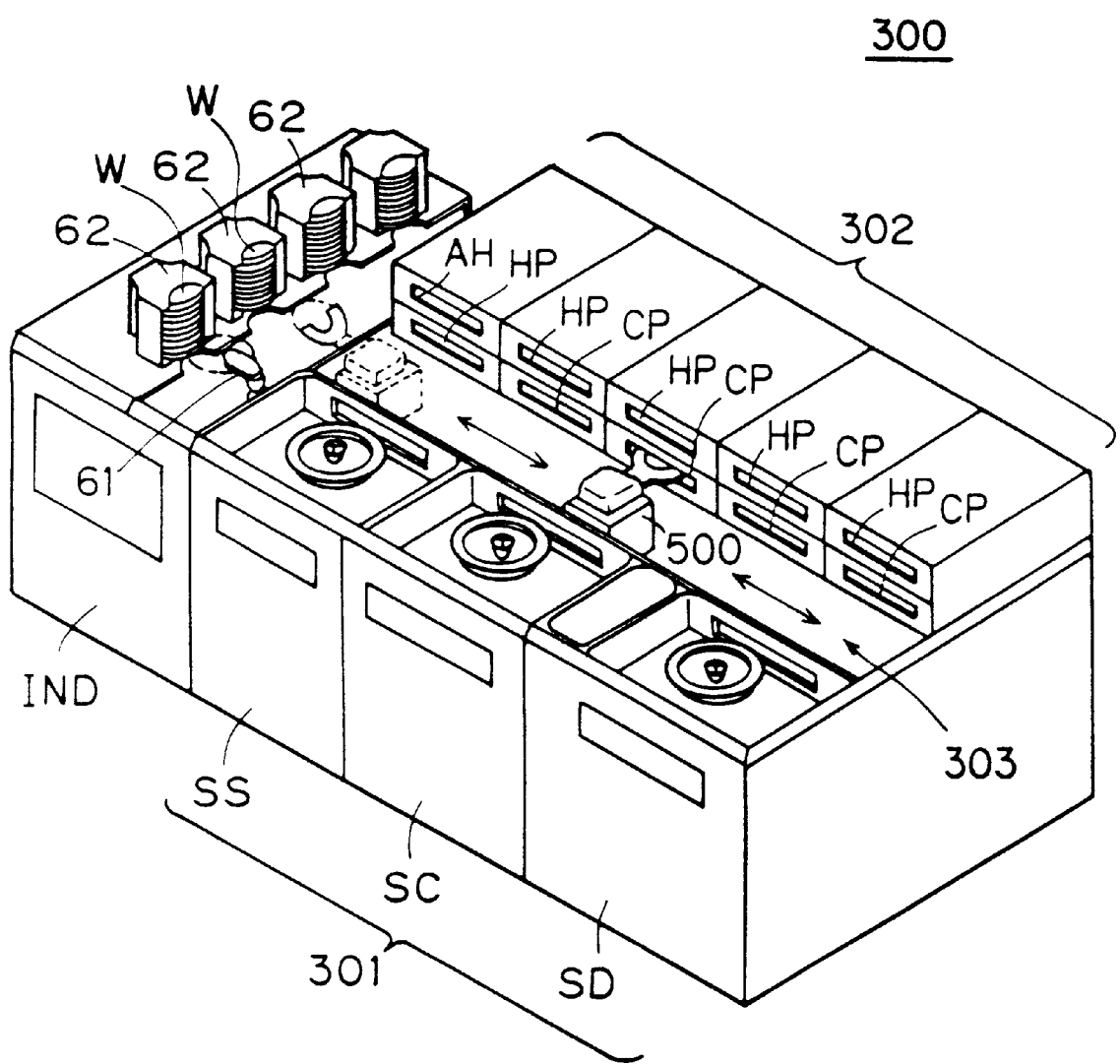
FIG. 1 is a perspective view of a substrate processing unit which incorporates a substrate processing apparatus to which a substrate holding apparatus according to the present invention is applied.

FIG. 1 is a perspective view showing an appearance of a substrate processing unit 300 as a whole which incorporates a substrate processing apparatus to which a substrate holding apparatus according to the present invention is applied.

The substrate processing unit 300 of FIG. 1 is an apparatus for performing a series of processes, such as scrubbing, coating, developing, adhesion strengthening, heating and cooling, onto a substrate W. The substrate processing unit 300 includes a first substrate processing area 301 at a front side, a second substrate processing area 302 at a rear side, and a transportation area 303 between the first substrate processing area 301 and the second substrate processing area 302.

In the first substrate processing area 301, a rotation type scrubbing apparatus (i.e., spin scrubber) SS is for rinsing a substrate, a rotation type coating apparatus (i.e., spin coater) SC is for performing coating with processing liquid, and a rotation type developing apparatus (i.e., spin developer) SD is for developing. In the second substrate processing area 302, an adhesion strengthening part AH for performing adhesion strengthening, a substrate heating part (i.e., hot plate) HP for heating, and a substrate cooling part (i.e., cooling plate) CP for cooling are arranged. In the transportation area 303, a substrate transporting apparatus 500 is disposed for free movement.

Further, an indexer IND for loading and unloading the substrate W is disposed on the side to the substrate processing unit 300. A moving robot 61 of the indexer IND takes out the substrate W from a cassette 62 and subsequently feeds the substrate W into the substrate transporting apparatus 500, or conversely, returns the substrate W which was already processed through the series of processes into the cassette 62 from the substrate transporting apparatus 500.

In the transportation area 303, the substrate transporting apparatus 500 is movable toward and away from the first substrate processing area 301 and the second substrate processing area 302, and exchanges a processed substrate W and an unprocessed substrate W between the respective processing apparatuses or between the respective processing parts.

A-2. Structure of Substrate Holding Apparatus

Figure 2:
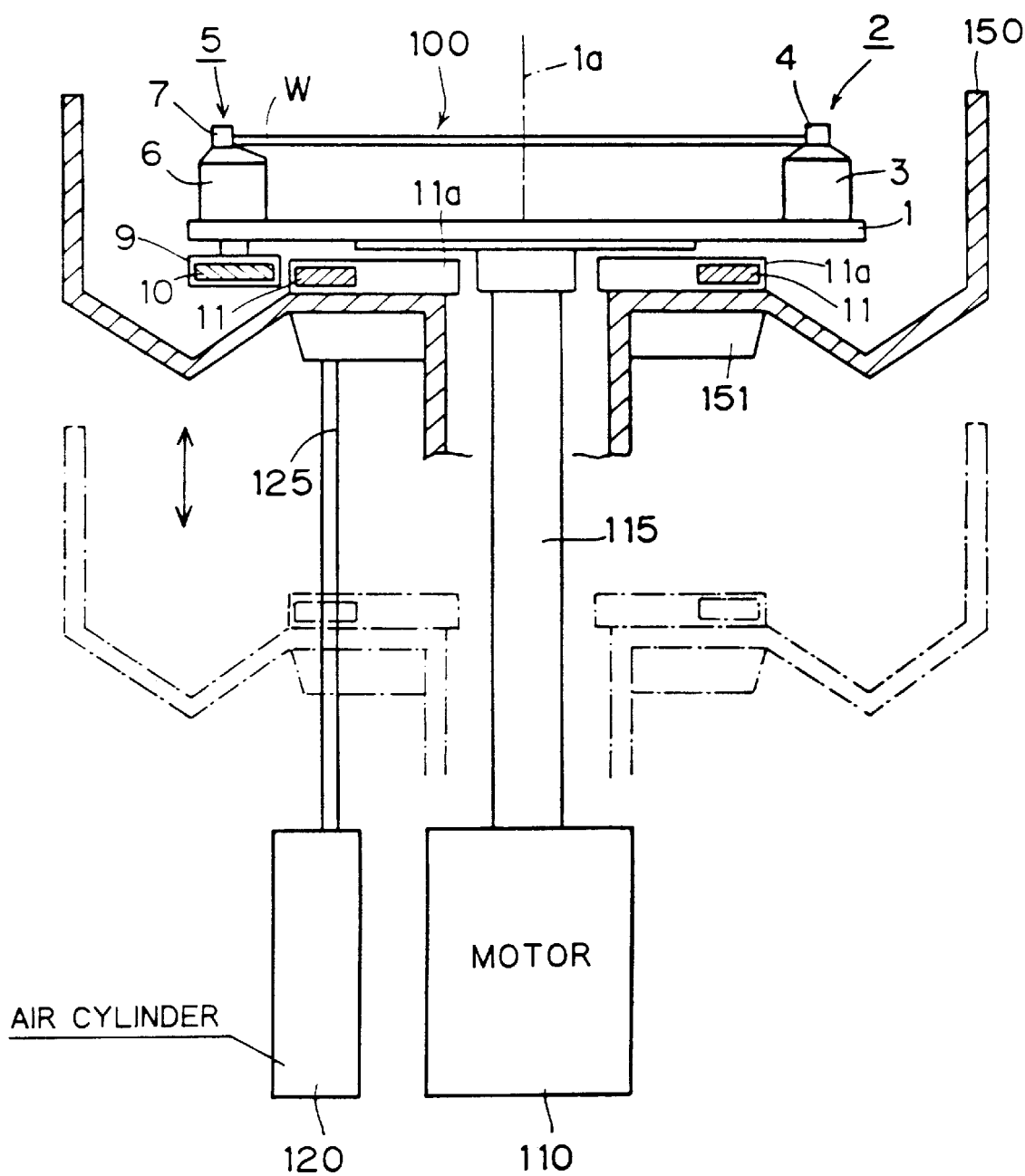
FIG. 2 is a view of a rotation type scrubbing apparatus which is incorporated in the substrate processing unit of FIG. 1.

FIG. 2 shows the rotation type scrubbing apparatus SS which is incorporated in the substrate processing unit 300. The rotation type scrubbing apparatus SS includes a substrate holding apparatus 100, a motor 110 for rotating a rotation base 1 which forms the substrate holding apparatus 100, a processing liquid collecting cup 150, and an air cylinder 120 for driving the processing liquid collecting cup 150 in a vertical direction.

Figure 3:
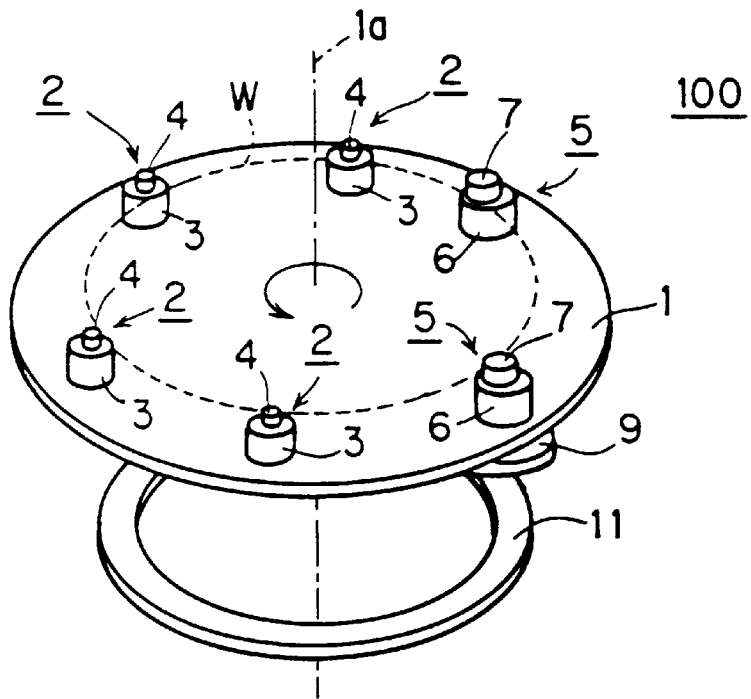
FIG. 3 is a perspective view of the substrate holding apparatus of FIG. 2.
Figure 4:
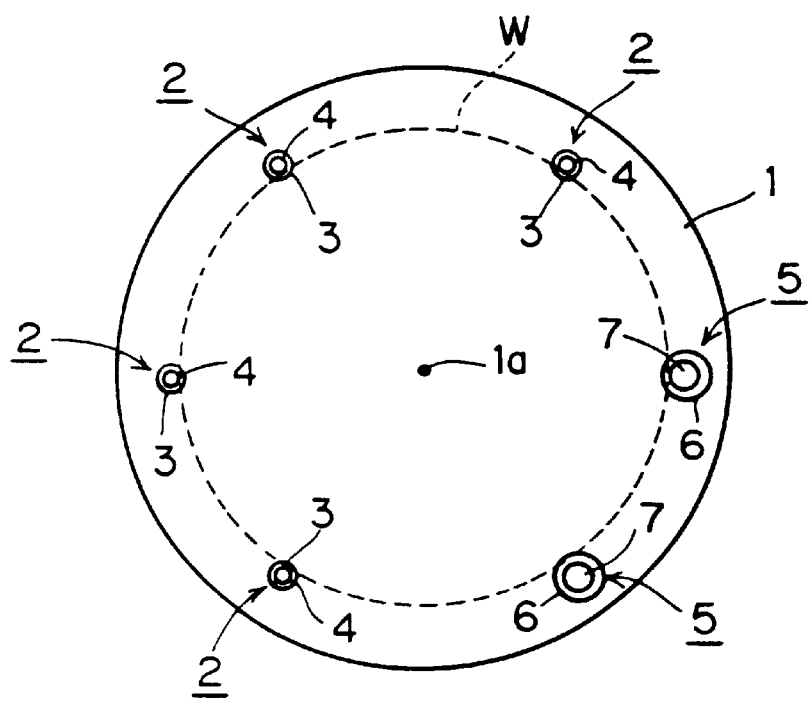
FIG. 4 is a plan view of the substrate holding apparatus of FIG. 2.

FIG. 3 is a perspective view of the substrate holding apparatus 100 of FIG. 2, and FIG. 4 is a plan view of the substrate holding apparatus 100.

The circular-shaped rotation base 1 is axially supported by a motor shaft 115 of the motor 110 so as to be rotated about a rotation axis 1a. To a top surface of the rotation base 1, a plurality of fixed holding members 2 and two revolvable holding members 5 are attached along a circumference which is co-axial with the rotation axis 1a. The fixed holding members 2 are each formed by a column-shaped substrate supporting member 3 and a column-shaped horizontal position restricting part 4 which has a smaller diameter than the substrate supporting member 3. Top surface portions of the substrate supporting members 3 of the fixed holding members 2 abut a peripheral edge portion of a back surface of the substrate W and outer peripheral surfaces of the horizontal position restricting parts 4 abut the outer peripheral edge of the substrate W, whereby the substrate W is horizontally supported and the position of the substrate W in the horizontal direction is restricted.

Figure 5A:
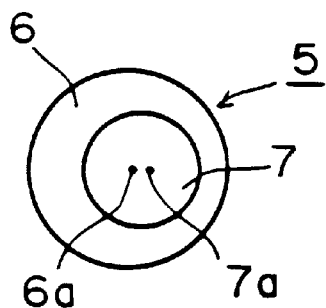
FIGS. 5A and 5B are a plan view and a side view, respectively, of a revolvable holding member which is used in the substrate holding apparatus.
Figure 5B:
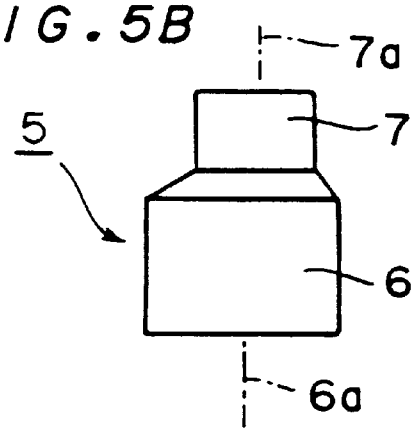

FIGS. 5A and 5B are a plan view and a side view, respectively, of the revolvable holding members 5. As shown in FIGS. 5A and 5B, the revolvable holding members 5 are each formed by a column-shaped supporting part 6 and a column-shaped holding part 7 which has a smaller diameter than the supporting part 6. Each supporting part 6 is attached to the rotation base 1 for free rotation about a rotation axis 6a which is co-axial with a central axis of the supporting part 6. Each holding part 7 is disposed on a top surface part of the supporting part 6, at an eccentric position with respect to the rotation axis 6a. In other words, the rotation axis 6a of the supporting part 6 and a central axis 7a of the holding part 7 are separated from each other by a predetermined distance.

Figure 6:
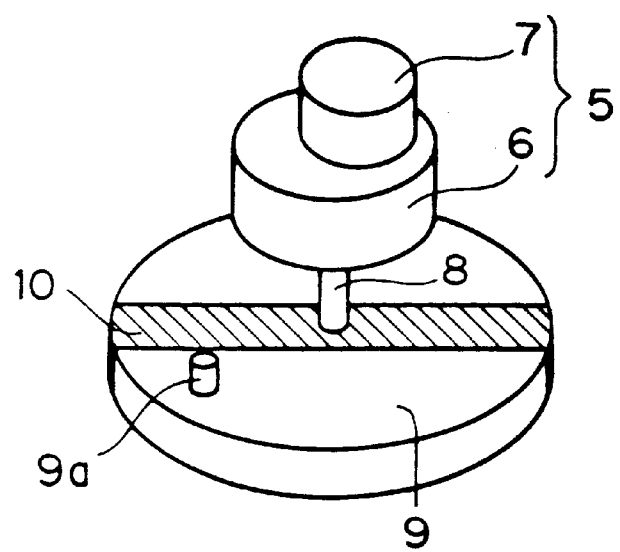
FIG. 6 is a perspective view of the revolvable holding member and a magnet holding part which is attached to a lower part of the revolvable holding member.

FIG. 6 is a perspective view of the revolvable holding member 5 and a magnet holding part which is attached to a lower part of the revolvable holding member 5. As shown in FIG. 6, to a lower part of the supporting part 6 of the revolvable holding member 5, a circular magnetic holding part 9 is attached through a revolvable axial member 8 which is co-axial with the rotation axis 6a. A rod-shaped permanent magnet 10 is incorporated in a central portion of the magnetic holding part 9. One end in the longitudinal direction of the permanent magnet 10 is an N-pole while the other end of the permanent magnet 10 is an S-pole. A pin 9a is disposed on a top surface of the magnetic holding part 9.

Referring to FIG. 2 again, a disk 11a incorporating a ring-shaped magnet 11 is disposed to an inside bottom surface of the processing liquid collecting cup 150. The disk 11a is located so that a central axis of the ring-shaped magnet 11 coincides with the rotation axis 1a. The ring-shaped magnet 11 is a permanent magnet. An N-pole is formed on an outer peripheral side and an S-pole is formed on an inner peripheral side of the ring-shaped magnet 11, for example.

Further, a cup base 151 is disposed externally to an outer bottom surface of the processing liquid collecting cup 150. The cup base 151 and the air cylinder 120 are connected to each other by an elevating pole 125. Hence, the air cylinder 120 freely moves the processing liquid collecting cup 150 in a vertical direction along the rotation axis 1a.

Although this embodiment requires the processing liquid collecting cup 150 to be freely moved in the vertical direction along the rotation axis 1a, the processing liquid collecting cup 150 may be fixed and the rotation base 1 may be freely moved in the vertical direction along the rotation axis 1a.

B-1. Operation Principles of Revolvable Holding Member

In the rotation type scrubbing apparatus SS having such a structure as above, as the processing liquid collecting cup 150 is moved in the vertical direction, the ring-shaped magnet 11 is moved close to or away from permanent magnet 10 which is incorporated in the magnetic holding part 9, whereby the revolvable holding members 5 revolve and hold the substrate W. This utilizes a phenomena that the direction of magnetic force which acts upon the magnetic holding part 9 is different depending on a relative positional relationship between the two magnets. The principles of this will be described in the following.

Figure 7A:
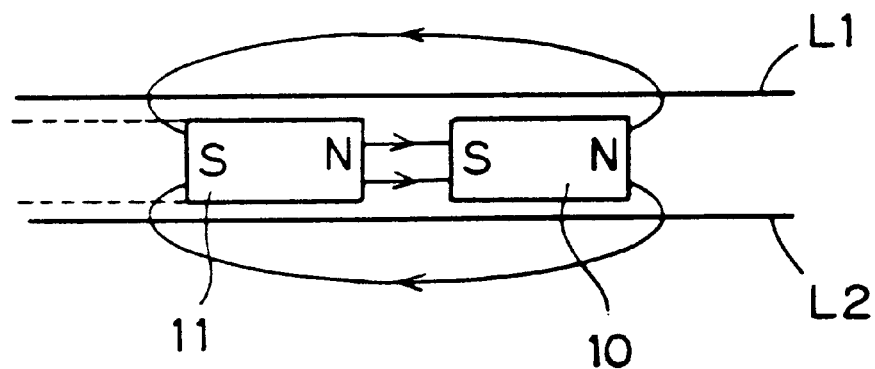
FIGS. 7A to 7C are views describing the directions of magnetic force which acts upon each magnet, depending on a positional relationship between two magnets relative to each other.
Figure 7B:
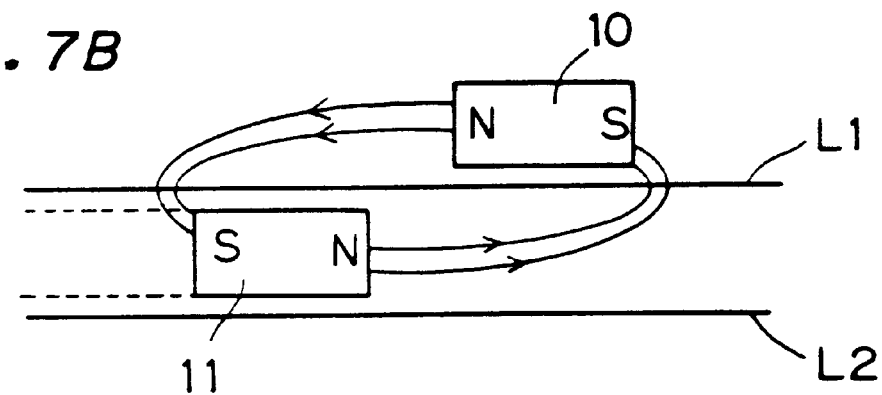
Figure 7C:
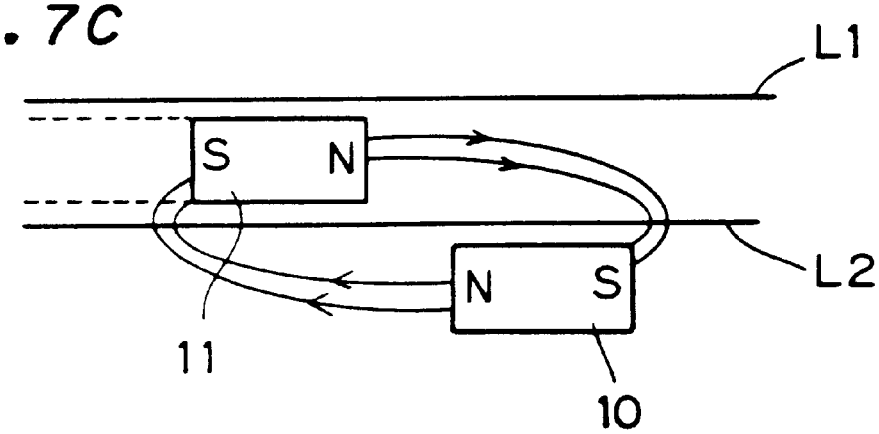

FIGS. 7A to 7C are views for describing the directions of magnetic force which acts upon the permanent magnet 10, depending on a positional relationship between the two magnets relative to each other.

First, when the ring-shaped magnet 11 and the rod-shaped permanent magnet 10 have such a positional relationship as that shown in FIG. 7A, that is, when the both magnets are between a line L1 and a line L2, the permanent magnet 10 is subjected to force from the S-pole of the permanent magnet 10 toward the N-pole of the ring-shaped magnet 11.

This is because the direction of a magnetic line of flux of the ring-shaped magnet 11 is from the left-hand side toward the right-hand side in FIG. 7A between the lines L1 and L2.

On the other hand, outside the lines L1 and L2 as viewed from the ring-shaped magnet 11, the direction of a magnetic line of flux of the ring-shaped magnet 11 is from the right-hand side toward the left-hand side. Hence, as shown in FIGS. 7B and 7C, when the permanent magnet 10 is above the line L1 or below the line L2, force which directs the N-pole of the permanent magnet 10 toward the N-pole of the ring-shaped magnet 11 is created.

During movement of the ring-shaped magnet 11 in the vertical direction, when the ring-shaped magnet 11 passes the line L1 or L2 as viewed in a positional relationship relative to the permanent magnet 10, force which revolves the permanent magnet 10 is created.

B-2. Operation of Revolvable Holding Member

Figure 8A:
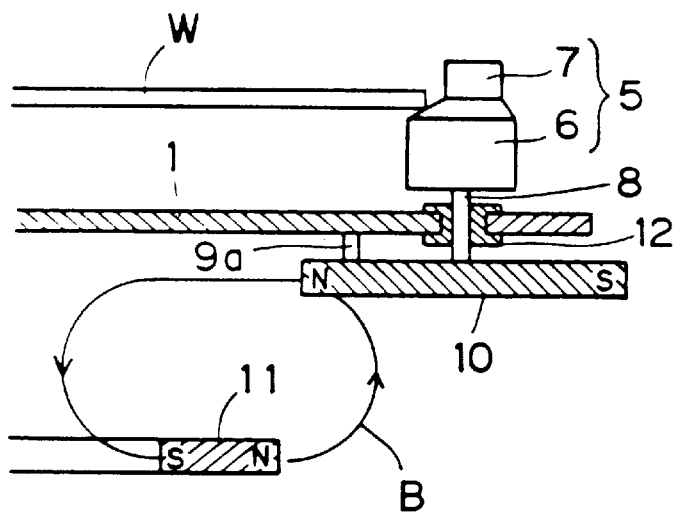
FIGS. 8A to 8C and 9A to 9C are views describing an operation of the revolvable holding member.
Figure 8B:
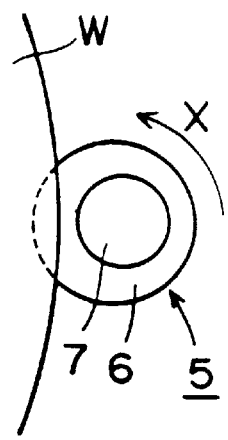
Figure 8C:
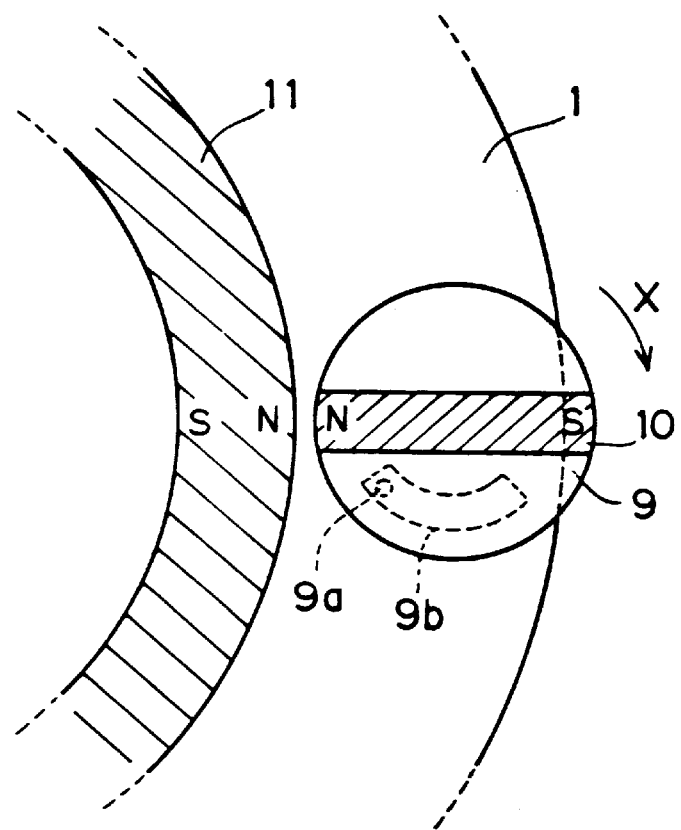
Figure 9A:
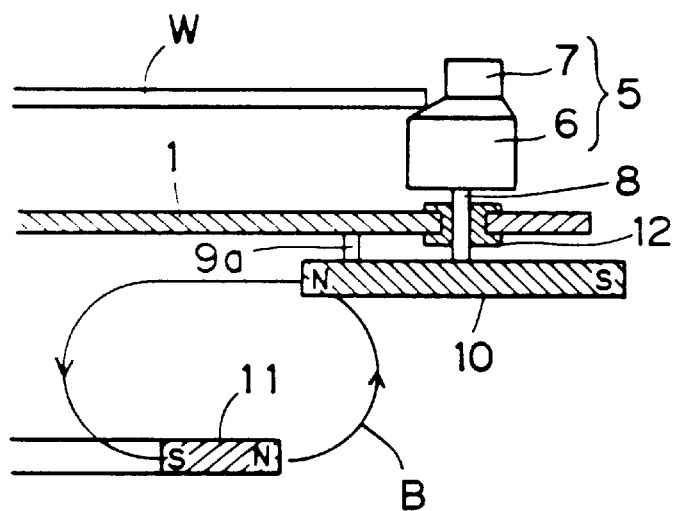
Figure 9B:
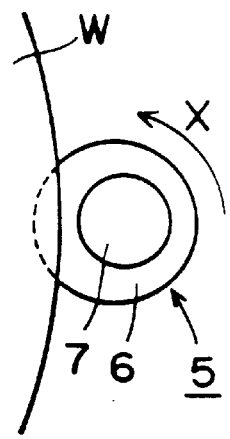
Figure 9C:
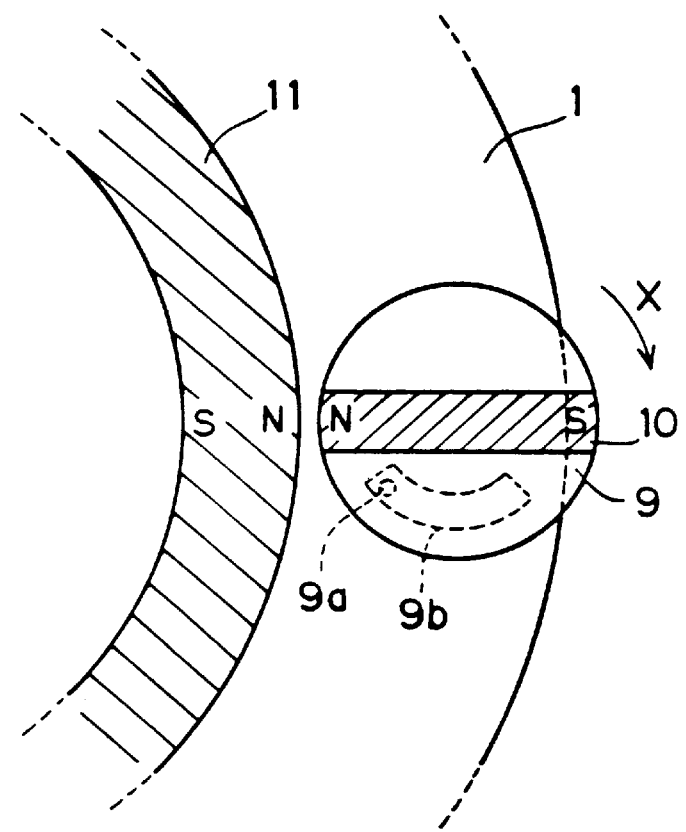

FIGS. 8A to 8C and 9A to 9C are views for describing an operation of the revolvable holding members. FIGS. 8A and 9A are partial cross sectional views of the revolvable holding member and portions around the same. FIGS. 8B and 9B are plan views of the revolvable holding member as viewed from above. FIGS. 8C and 9C are plan views of the revolvable holding member as viewed from below.

As shown in FIGS. 8A and 9A, the revolvable axial member 8 of the revolvable holding member 5 is supported for free rotation by the rotation base 1 through a revolvable bearing 12. The revolvable bearing 12 includes a bearing mechanism, for example, to suppress rolling friction.

Prior to processing of the substrate W, the ring-shaped magnet 11 is positioned below the rotation base 1, separated, as shown in FIG. 8A. At this stage, a magnetic line of flux B of the ring-shaped magnet 11 is in a direction from the peripheral side of the rotation base 1 toward the center of the rotation base 1 (i.e., a direction from the right-hand side toward the left-hand side in FIG. 8A), at the height where the permanent magnet 10 is disposed. This is the same as the condition shown in FIG. 7B in that the N-pole of the permanent magnet 10 is pulled toward the center of the rotation base 1, thereby setting the magnetic holding part 9 to the condition which is shown in FIG. 8C. In this condition, as shown in FIG. 8B, outer peripheral surfaces of the holding parts 7 of the revolvable holding members 5 are separated from the outer peripheral edge of the substrate W.

During processing of the substrate W, the ring-shaped magnet 11 is moved upward toward the rotation base 1 (See the condition shown in FIG. 9A), as the processing liquid collecting cup 150 is moved upward. This is the same as the condition shown in FIG. 7A in that the S-pole of the permanent magnet 10 is pulled toward the N-pole of the ring-shaped magnet 11. That is, during elevation of the ring-shaped magnet 11, the S-pole of the permanent magnet 10 is pulled toward the ring-shaped magnet 11 when the ring-shaped magnet 11 passes a predetermined line, thereby revolving the revolvable holding members 5 in the direction of the arrow Y in FIGS. 9B and 9C. The revolvable holding members 5 revolve to a position at which the pin 9a contacts an edge portion of an arc-shaped small hole 9b which is formed in the bottom surface of the rotation base 1 (i.e., a position at which the permanent magnet 10 diagonally crosses the diameter direction of the rotation base 1). At this stage, since the holding parts 7 of the revolvable holding members 5 are disposed eccentrically with respect to the rotation axes 6a of the supporting parts 6, as shown in FIG. 9B, the outer peripheral surfaces of the holding parts 7 abut the outer peripheral edge of the substrate W, and therefore, the substrate W is held in the horizontal direction.

Next, after processing of the substrate W, the ring-shaped magnet 11 is moved downward, below the rotation base 1 once again. As the ring-shaped magnet 11 is moved downward, when the ring-shaped magnet 11 passes a predetermined line, the N-pole of the permanent magnet 10 is pulled toward the ring-shaped magnet 11, thereby revolving the revolvable holding members 5 in the direction of the arrow X in FIGS. 8B and 8C. The revolvable holding members 5 return to the condition which is shown in FIGS. 8B and 8C, whereby the outer peripheral surfaces of the holding parts 7 of the revolvable holding members 5 are separated from the outer peripheral edge of the substrate W, and therefore, the substrate W is released.

During the processes described above, when the ring-shaped magnet 11 is moved to an upper position, the revolvable holding members 5 are revolved only to the position at which the permanent magnet 10 diagonally crosses the diameter direction of the rotation base 1. Instead, the revolvable holding members 5 may be revolved to a direction in which the S-pole of the permanent magnet 10 turns to the center of the rotation base 1, or to a position between these two positions. Such adjustment may be realized by changing the size of the small hole 9b. Nevertheless, since maximum revolution force results at the position described above at which the permanent magnet 10 diagonally crosses the diameter direction of the rotation base 1, it is possible to obtain the largest revolution force also during descending of the ring-shaped magnet 11 away from the rotation base 1, while maintaining large holding force with which the holding parts 7 of the revolvable holding members 5 hold the substrate W during processing of the substrate.

Figure 10:
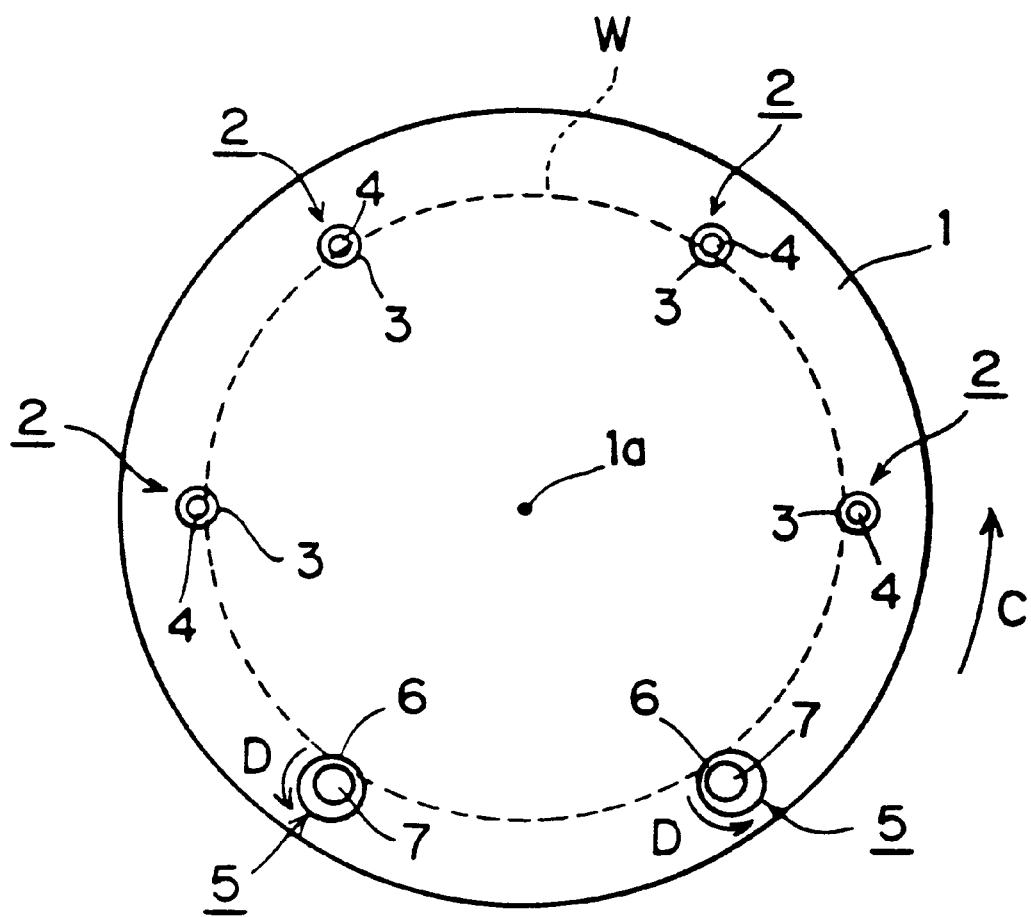
FIG. 10 is a view describing an effect of holding which is performed by the revolvable holding member.

FIG. 10 is a view for describing an effect of holding by the two revolvable holding members 5. In the substrate holding apparatus 100 described above, as shown in FIG. 10, the two revolvable holding members 5 are located adjacent to each other, i.e., at asymmetric positions with respect to the rotation axis 1a. When the substrate W is rotated together with the rotation base 1 in the direction of the arrow C, the revolvable holding members 5 are revolved in the direction of the arrow D so that the holding parts 7 hold the substrate W at the outer peripheral edge of the substrate W. At this stage, since the two revolvable holding members 5 are positioned asymmetrical with respect to the rotation axis 1a, the substrate W is effectively subjected to the holding power of the revolvable holding members 5. Further, since the fixed holding members 2 are disposed facing the revolvable holding members 5, even if the holding power is weak, no slipping is created between the holding parts 7 and the substrate W. Still further, since the revolvable holding members 5 are revolved in the direction of the arrow D as the substrate W is rotated together with the rotation base 1 in the direction of the arrow C, the holding parts 7 can swiftly hold the substrate W at the outer peripheral edge of the substrate W during initial rotation of the substrate W associated with the start of rotation of the rotation base 1, whereby slipping of the substrate W due to inertia force is suppressed. For a similar reason, if the rotation base 1 is to be rotated in an opposite direction to the direction of the arrow C shown in FIG. 10, it is desirable to revolve the revolvable holding members 5 in an opposite direction to the direction of the arrow D shown in FIG. 10.

The number of the revolvable holding members 5 is not limited to two, but may be any number larger than one. Further, the positions of the revolvable holding members 5 may be symmetrical with respect to the rotation axis 1a. Still, as described above, the substrate W is more effectively subjected to the holding power if a plurality of the revolvable holding members 5 are disposed asymmetrical with respect to the rotation axis 1a.

In addition, although the holding parts 7 of the revolvable holding members 5 are shaped like a column according to the first preferred embodiment, contacting portions of the holding parts 7 to abut the substrate W only have to be a curved surface which has a convex shape, since such a shape reduces the size of areas where the holding parts 7 contact the substrate W. Further alternatively, the contacting portions of the holding parts 7 may be flat rather than convex curve.

Since a structure as above makes it unnecessary to consider the location of the center of gravity of each revolvable holding member and allows to form the revolvable holding members in a similar shape to that of the fixed holding members, the revolvable holding members remain in excellent balance during the rotation processing. Moreover, since the magnetic force of the ring-shaped magnet keeps acting on the permanent magnet which is connected to the revolvable holding members during the processing, it is possible to hold the rotating substrate without idly rotating the substrate.

Modification of First Preferred Embodiment

Although the revolvable holding members 5 are directly connected by the revolvable axial members 8 to the magnetic holding part 9 which incorporates the permanent magnet 10, the revolvable holding members 5 and the magnetic holding part 9 may be connected to each other through a power transmission mechanism.

Figure 11:
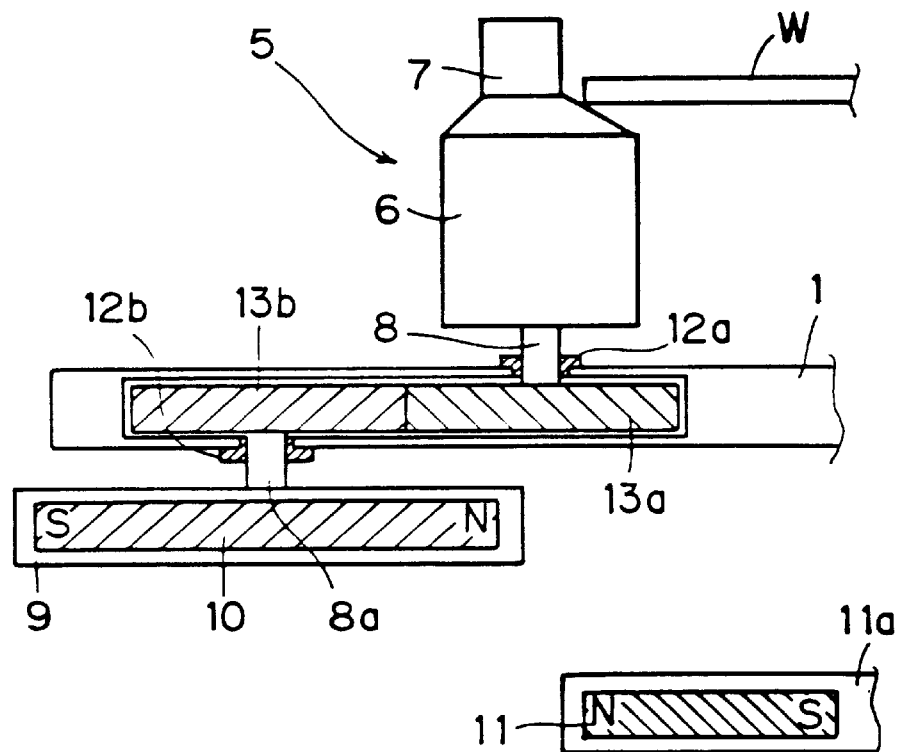
FIGS. 11 and 12 are views showing the substrate holding apparatus as it is with a power transmission mechanism disposed.
Figure 12:
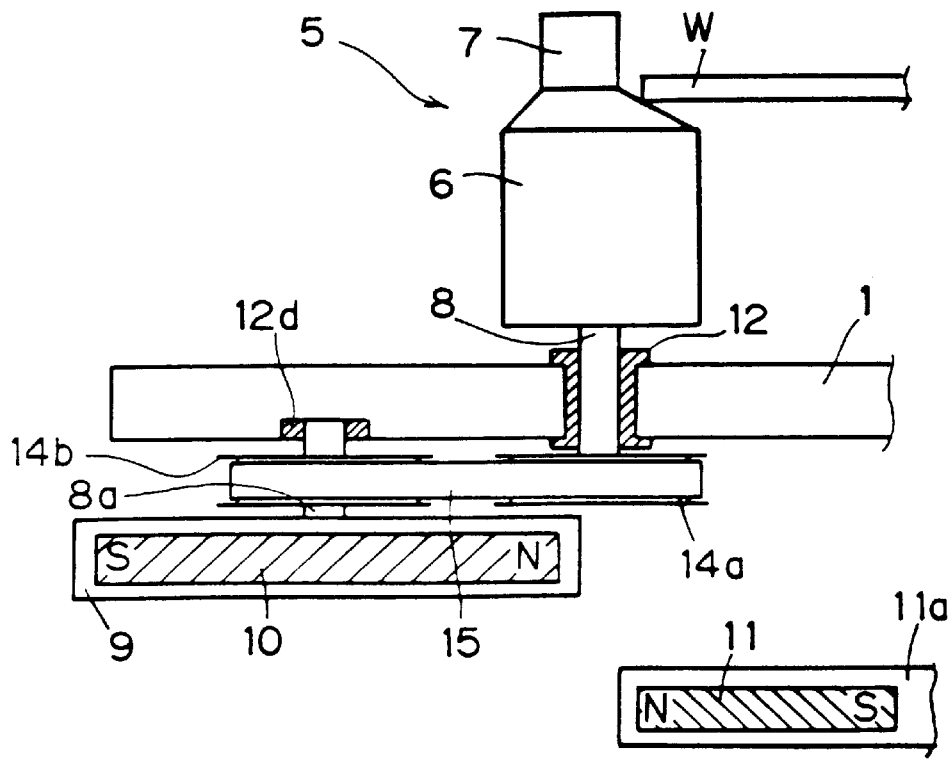
Figure 13A:
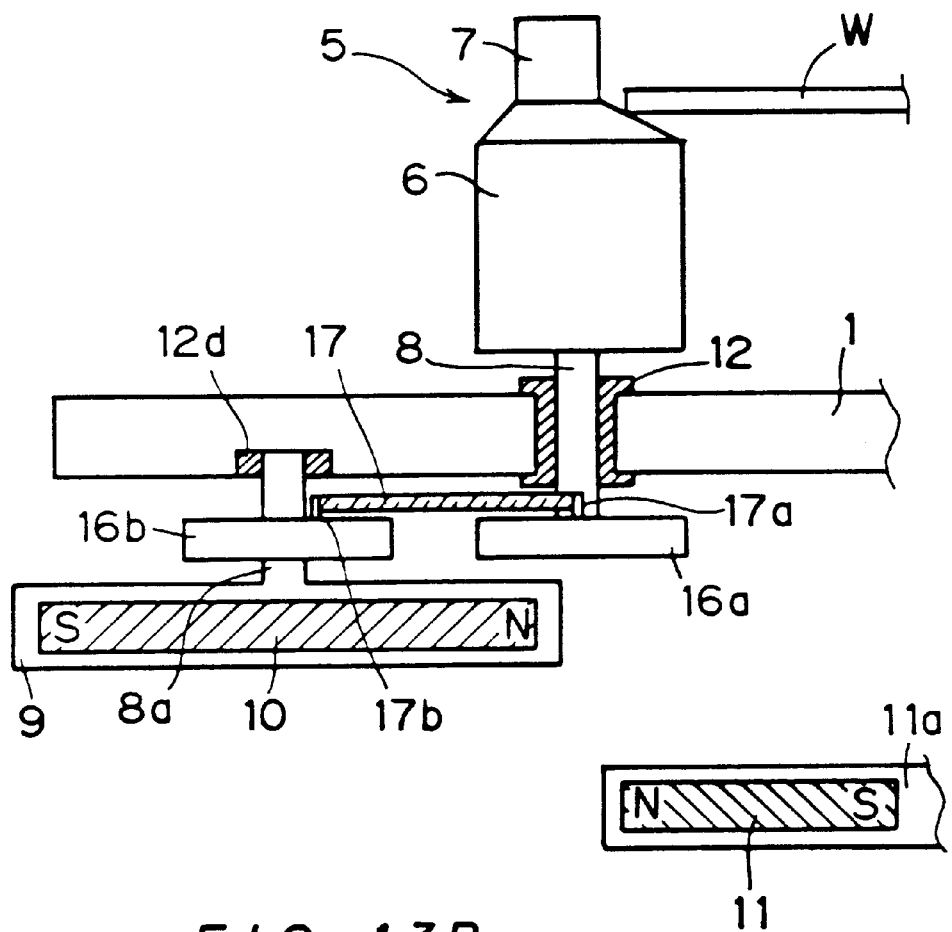
FIG. 13A is a view showing the substrate holding apparatus as it is with a power transmission mechanism.
Figure 13B:
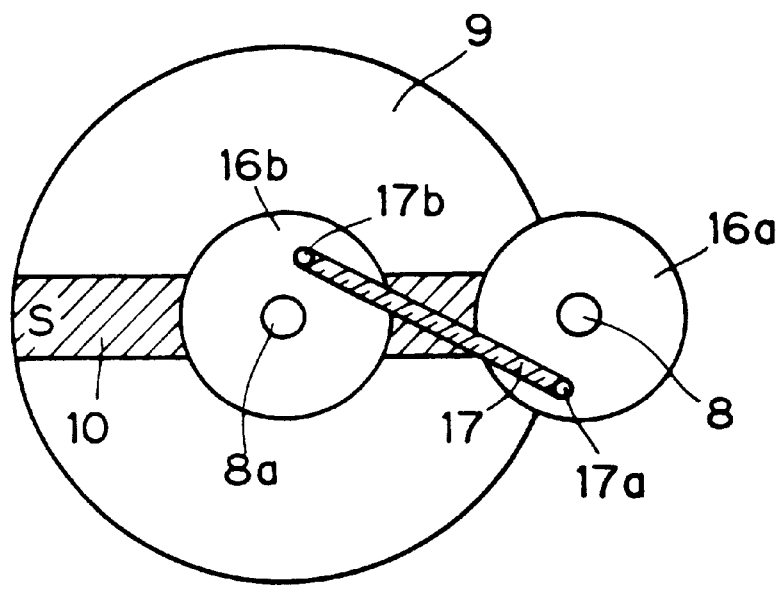
FIG. 13B is a plan view of the power transmission mechanism.

FIGS. 11 and 12 show the substrate holding apparatus as it is with a power transmission mechanism disposed. FIG. 13A shows the substrate holding apparatus as it is with the power transmission mechanism disposed. FIG. 13B is a plan view of the power transmission mechanism.

FIG. 11 shows an example where two gear wheels 13a and 13b are used. The two gear wheels 13a and 13b are disposed inside the rotation base 1, and the revolvable axial member 8 of the revolvable holding member 5 is connected to the gear wheel 13a through a revolvable bearing 12a. On the other hand, a revolvable axial member 8a of the magnetic holding part 9 which incorporates the permanent magnet 10 is connected to the gear wheel 13b through a revolvable bearing 12b. Since the two gear wheels 13a and 13b are engaged with each other inside the rotation base 1, the revolution force acting upon the magnetic holding part 9 is transmitted to the revolvable holding members 5.

FIG. 12 shows an example where pulleys and a belt are used. The revolvable axial member 8 of the revolvable holding member 5 is connected to a pulley 14a which is disposed below the rotation base 1 through the revolvable bearing 12. Further, a pulley 14b is fixed to the revolvable axial member 8a of the magnetic holding part 9, with a top end of the revolvable axial member 8a supported by a revolvable bearing 12d for free rotation. The revolution force acting upon the magnetic holding part 9 is transmitted to the revolvable holding member 5, through the pulley 14b, a belt 15 and the pulley 14a.

FIGS. 13A and 13B show an example where a link is used. The revolvable axial member 8 of the revolvable holding member 5 is connected to a rotation member 16a which is disposed below the rotation base 1 through the revolvable bearing 12. On the other hand, a rotation member 16b is fixed to the revolvable axial member 8a of the magnetic holding part 9, with a top end of the revolvable axial member 8a supported by a revolvable bearing 12d for free rotation. Further, hooks 17a and 17b are disposed to top surfaces of the two rotation members 16a and 16b and linked to each other by a link 17. The revolution force acting upon the magnetic holding part 9 is transmitted to the revolvable holding member 5 through the rotation member 16b, the link 17 and the rotation member 16a.

In each one of the three examples above, the revolution force acting upon the magnetic holding part 9 is created by moving the ring-shaped magnet 11 in the vertical direction, and the function of the revolution force is the same as in the first preferred embodiment. The structures according to the three examples above, in addition to creating a similar effect to that of the first preferred embodiment, deal with substrates W having different diameters from each other only by replacing the rotation base 1 but without replacing the ring-shaped magnet 11. Further, the structures according to the three examples above, it is possible to change the holding force upon the substrate W only if a gear wheel ratio or a diameter ratio of the pulleys or the rotation members.

Figure 14:
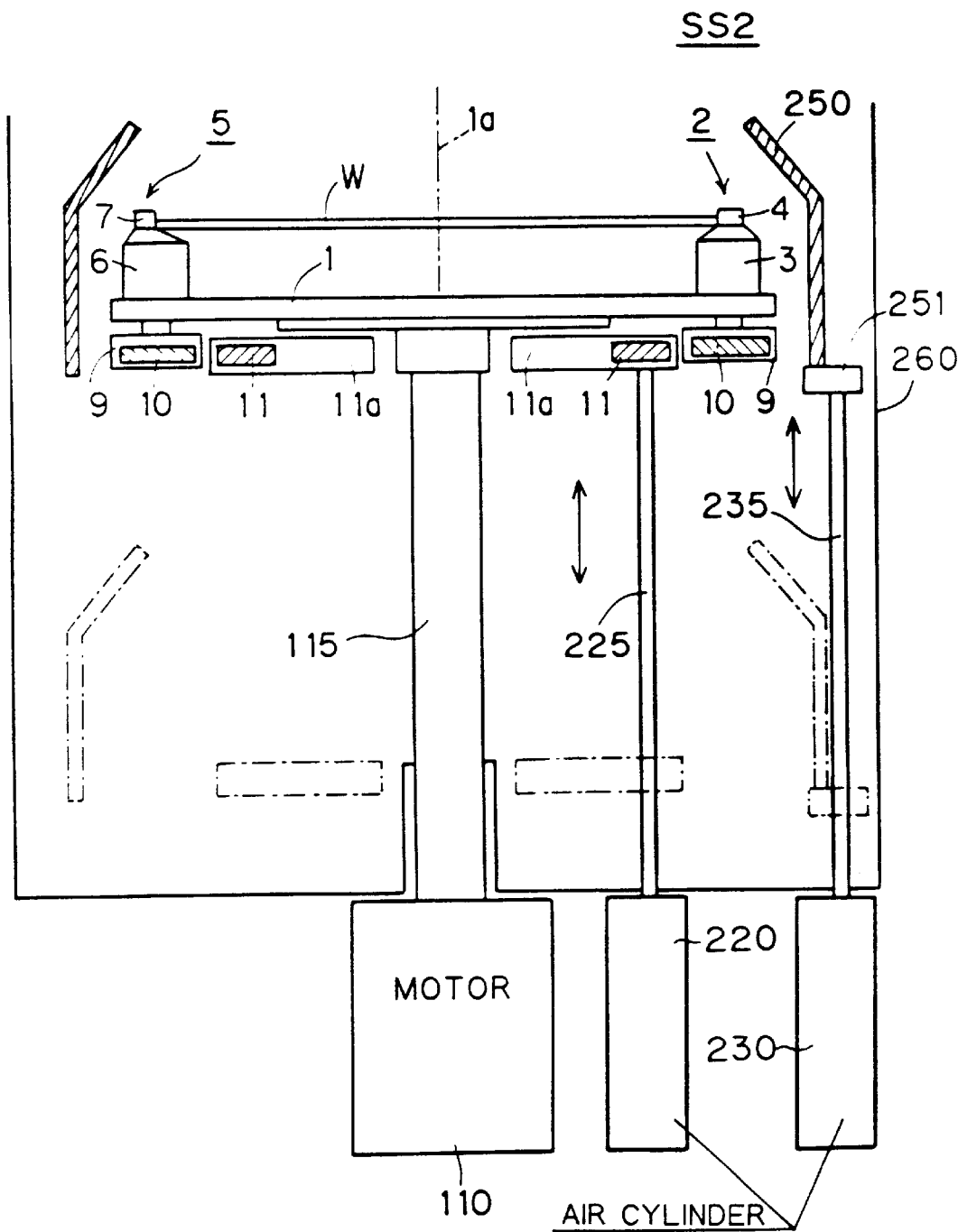
FIG. 14 is a view showing an other rotation type scrubbing apparatus which is incorporated in the substrate processing unit of FIG. 1.

In addition, the rotation type scrubbing apparatus SS of the rotation type substrate processing apparatus according to the first preferred embodiment may be a rotation type scrubbing apparatus SS2 described below. FIG. 14 shows other rotation type scrubbing apparatus SS2 which is incorporated in the substrate processing unit of FIG. 1.

A difference between the rotation type scrubbing apparatus SS2 is different from the rotation type scrubbing apparatus SS according to the first preferred embodiment is that while the rotation type scrubbing apparatus SS requires the processing liquid collecting cup 150 to include the disk 11a incorporating the ring-shaped magnet 11, the rotation type scrubbing apparatus SS2 uses two air cylinders to vertically move a cup 250 and the disk 11a independently of each other. In other words, two air cylinders 220 and 230 are disposed below a stainless steel bath 260 for collection of the processing liquid, and the disk 11a incorporating the ring-shaped magnet 11 is connected to the air cylinder 220 through a connection rod 225 while a cup base 251 of the cup 250 is connected to the air cylinder 230 through a connection rod 235.

The structure above as well obtains a similar effect to that of the first preferred embodiment. Further, in the rotation type scrubbing apparatus SS2, the air cylinder 220 moves the ring-shaped magnet 11 upward to hold the substrate W, and after confirming that the substrate W is held, the air cylinder 230 moves the cup 250 upward and the processing is started. Hence, it is possible to hold the substrate W without fail.

In addition, while the substrate W is held using the revolvable holding members 5 in the first preferred embodiment, the holding members are not limited to revolvable holding members. Rather, the holding members only have to be movable so as to hold the substrate W.

Figure 15A:
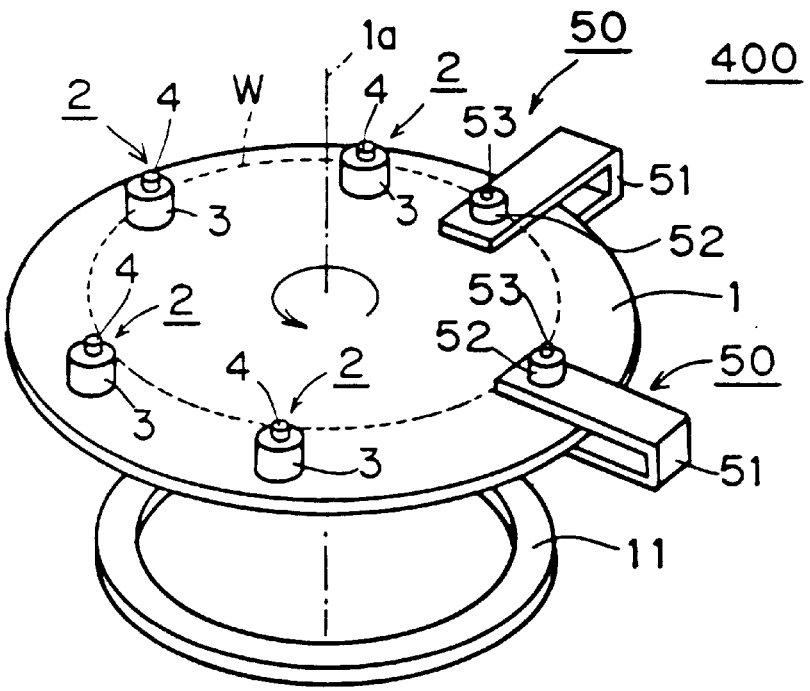
FIGS. 15A and 15B are views describing the substrate holding apparatus which uses a slidable holding member.
Figure 15B:
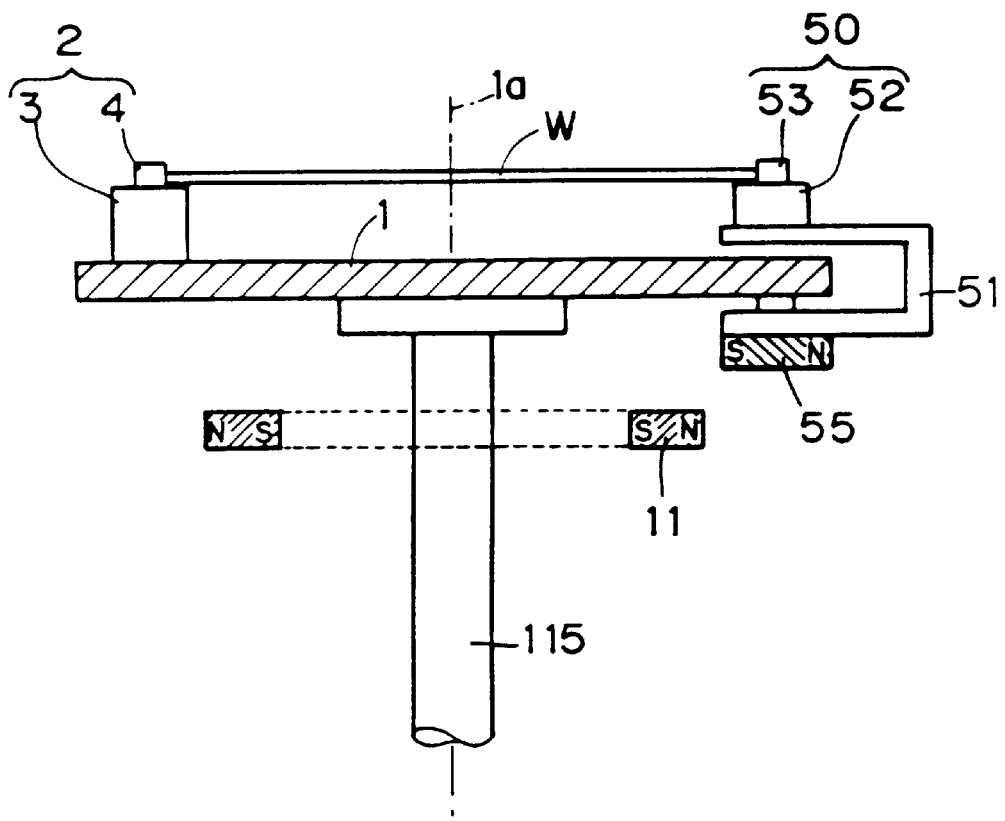

FIGS. 15A and 15B are a perspective view and a partial cross sectional view, respectively, of the substrate holding apparatus which uses a slidable holding member. A difference between this substrate holding apparatus 400 and the substrate holding apparatus 100 of FIG. 3 is that while the substrate holding apparatus 100 includes the revolvable holding members 5, the substrate holding apparatus 400 includes two slidable holding members 50 which are disposed adjacent to each other.

The slidable holding members 50 are each formed by a column-shaped supporting part 52 and a column-shaped holding part 53 which has a smaller diameter than the supporting part 52. The slidable holding members 50 are fixed to a linkage member 51 which is shaped in cross section like a rectangle omitting one vertical side. The linkage member 51 is movably supported in the direction of the diameter of the rotation base 1. A permanent magnet 55 which is coated be a water-proof resin is fixed to a bottom surface of the linkage member 51. Since the other parts of the structure are the same as that of the substrate holding apparatus 100 according to the first preferred embodiment, a redundant description will be simply omitted.

During processing of a substrate within the substrate holding apparatus 400, the ring-shaped magnet 11 is in an elevated position which is the same as the condition shown in FIG. 7A, and hence, an S-pole side of the permanent magnet 55 is pulled toward the ring-shaped magnet 11. As the S-pole side of the permanent magnet 55 is pulled toward the ring-shaped magnet 11, the slidable holding members 50 as well are pulled toward the center of the rotation base 1, whereby an outer peripheral surface of the holding part 53 abuts the outer peripheral edge of the substrate W and the substrate W is held in the horizontal direction.

Further, before and after processing of a substrate, the ring-shaped magnet 11 is in a descended position. As already described, when the ring-shaped magnet 11 passes a predetermined line as viewed in a positional relationship relative to the permanent magnet 55 as the ring-shaped magnet 11 is moved downward, at the height where the permanent magnet 55 is disposed, the direction of a magnetic line of flux is reversed. This reverses the direction of the force which acts upon the permanent magnet 55. Hence, the slidable holding members 50 are pulled away from the center of the rotation base 1, whereby the outer peripheral surface of the holding part 53 leaves the outer peripheral edge of the substrate W and the substrate W is released.

Thus, application of the slidable holding members 50 as well obtains the same effect as that of the first preferred embodiment which uses the revolvable holding members 5.

In the substrate holding apparatus 400 as well, the number of the slidable holding members 50 is not limited to two, but may be any number larger than one. Further, the positions of the slidable holding members 50 may be symmetrical with respect to the rotation axis 1*a*.

Although the substrate holding apparatus of the present invention is applied to the rotation type scrubbing apparatus SS according to the first preferred embodiment, the substrate holding apparatus of the present invention may be applied to other types of rotation type substrate processing apparatuses (e.g., a rotation type coating apparatus and a rotation type developing apparatus).

Further, although the first preferred embodiment requires to use the air cylinder 120 to move the ring-shaped magnet 11 in the vertical direction, means for moving the ring-shaped magnet 11 in the vertical direction is not limited to this. Rather, an actuator or a screw feeding mechanism which provides driving from an actuator or a motor may be used.

Second Preferred Embodiment

Figure 16A:
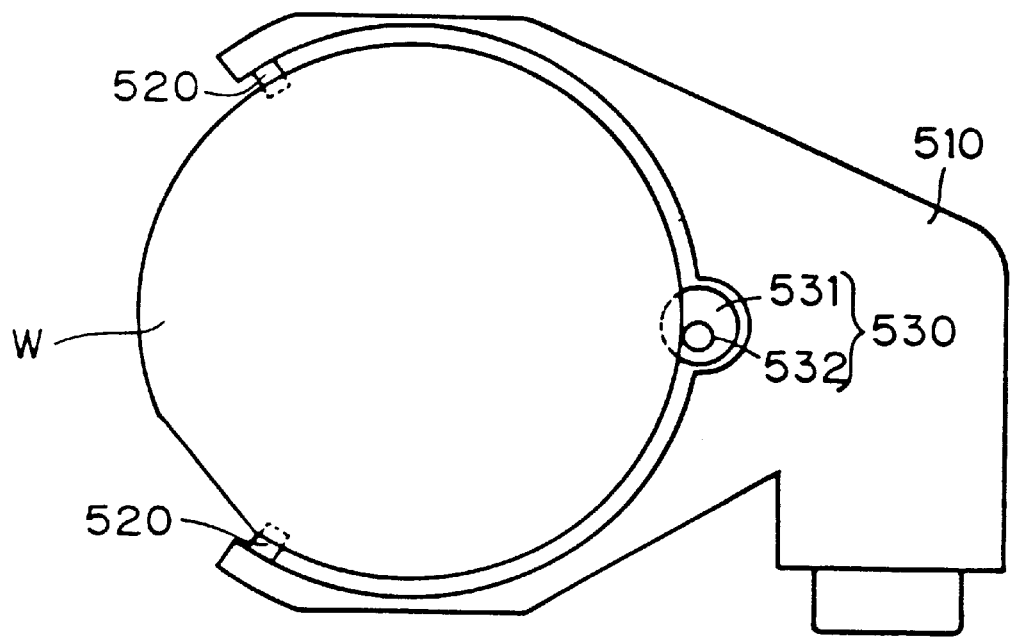
FIGS. 16A and 16B are views describing a transportation arm of a substrate transporting apparatus to which the substrate holding apparatus according to the present invention is applied.
Figure 16B:
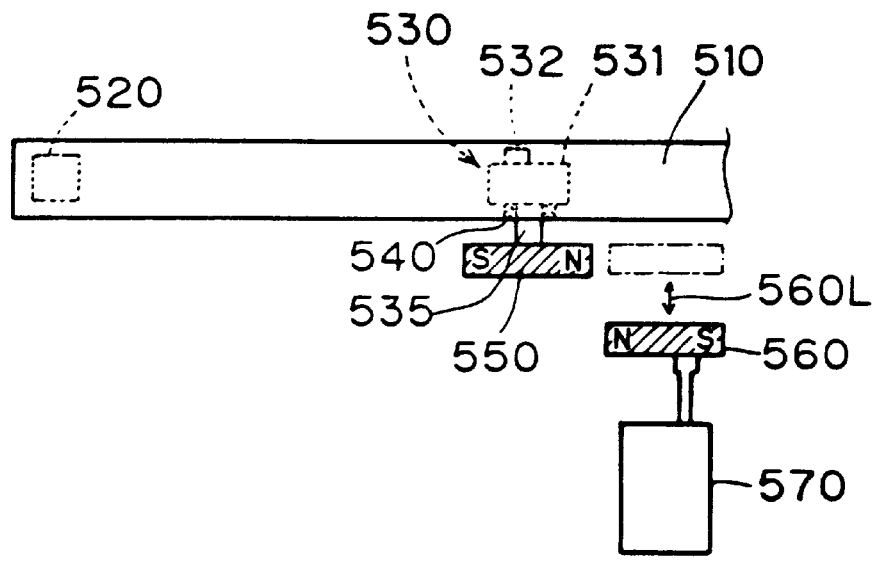

The substrate holding apparatus of the present invention is applicable not only to a rotation type substrate processing apparatus but also to various apparatuses which have a function of holding a substrate (e.g., the substrate transporting apparatus 500 shown in FIG. 1). FIGS. 16A and 16B are a plan view and a partial cross sectional view, respectively, of a transportation arm of the substrate transporting apparatus 500 to which the substrate holding apparatus of the present invention is applied.

A transportation arm 510 of the substrate transporting apparatus 500 includes two fixed holding members 520 and one revolvable holding member 530. A permanent magnet 560 is disposed below the transportation arm 510. The permanent magnet 560, driven by an actuator 570, is freely movable in the parallel direction of the central axis of the substrate W (i.e., the direction of the arrow 560L in FIG. 16B).

The revolvable holding member 530 is similar in structure to the revolvable holding members 5 of the first preferred embodiment in that the revolvable holding member 530 is formed by a column-shaped supporting part 531 and a column-shaped holding part 532 which has a smaller diameter than the supporting part 531. The supporting part 531 is attached to the transportation arm 510, with a central axis of the supporting part 531 as an axis for rotation, for free revolution. The holding part 532 is disposed to a top surface portion of the holding part 531, at an eccentric position with respect to the rotation axis of the supporting part 531. Further, a permanent magnet 550 is attached to the revolvable holding member 530 through a revolvable axial member 535. The revolvable axial member 535 of the revolvable holding member 530 is revolvably supported by the transportation arm 510 through a revolvable bearing 540. The revolvable bearing 540 includes a bearing mechanism, for instance, to suppress rolling friction.

An operation of the revolvable holding member 530 is the same as that of the revolvable holding members 5 of the first preferred embodiment. That is, the revolvable holding member 530 is revolved as the actuator 570 moves the permanent magnet 560 close to the transportation arm 510 (i.e., the position of the dotted line in FIG. 16B) or away from the transportation arm 510 (i.e., the position of the solid line in FIG. 16B) so that the holding part 532 locates, holds or releases the substrate W.

In the substrate holding apparatus according to the second preferred embodiment, since a substrate is even released utilizing magnetic force rather than gravity, even with the substrate inclined at an angle, it is possible to hold and release the substrate by means of a simple structure.

The magnetic line of flux of the permanent magnet 560 exists in a space which surrounds the permanent magnet 560. Hence, the direction in which the permanent magnet 560 moves is not limited to the parallel direction of the central axis of the substrate W. Rather, as a relative positional relationship with the permanent magnet 550, the permanent magnet 560 may be moved in a direction close to or away from the permanent magnet 550 (e.g., the perpendicular direction to the plane of FIG. 16B).

Modification of Second Preferred Embodiment

Figure 17A:
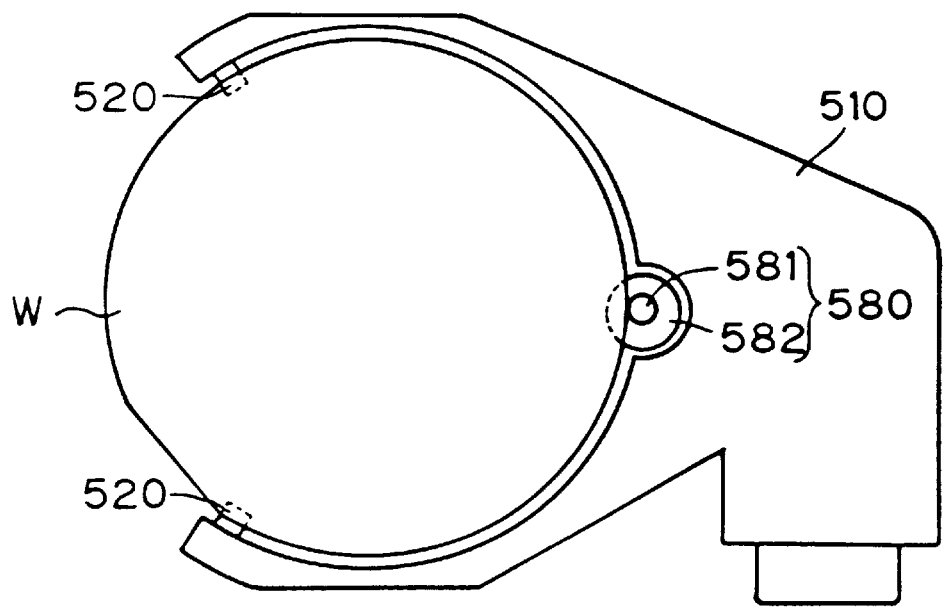
FIGS. 17A and 17B are views for describing a transportation arm of other substrate transporting apparatus to which the substrate holding apparatus according to the present invention is applied.
Figure 17B:
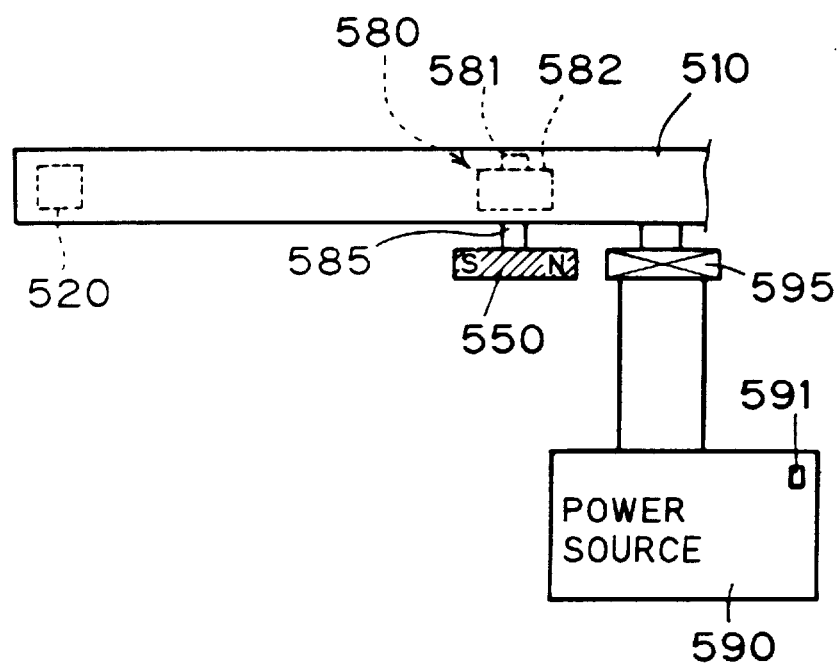
Figure 18:
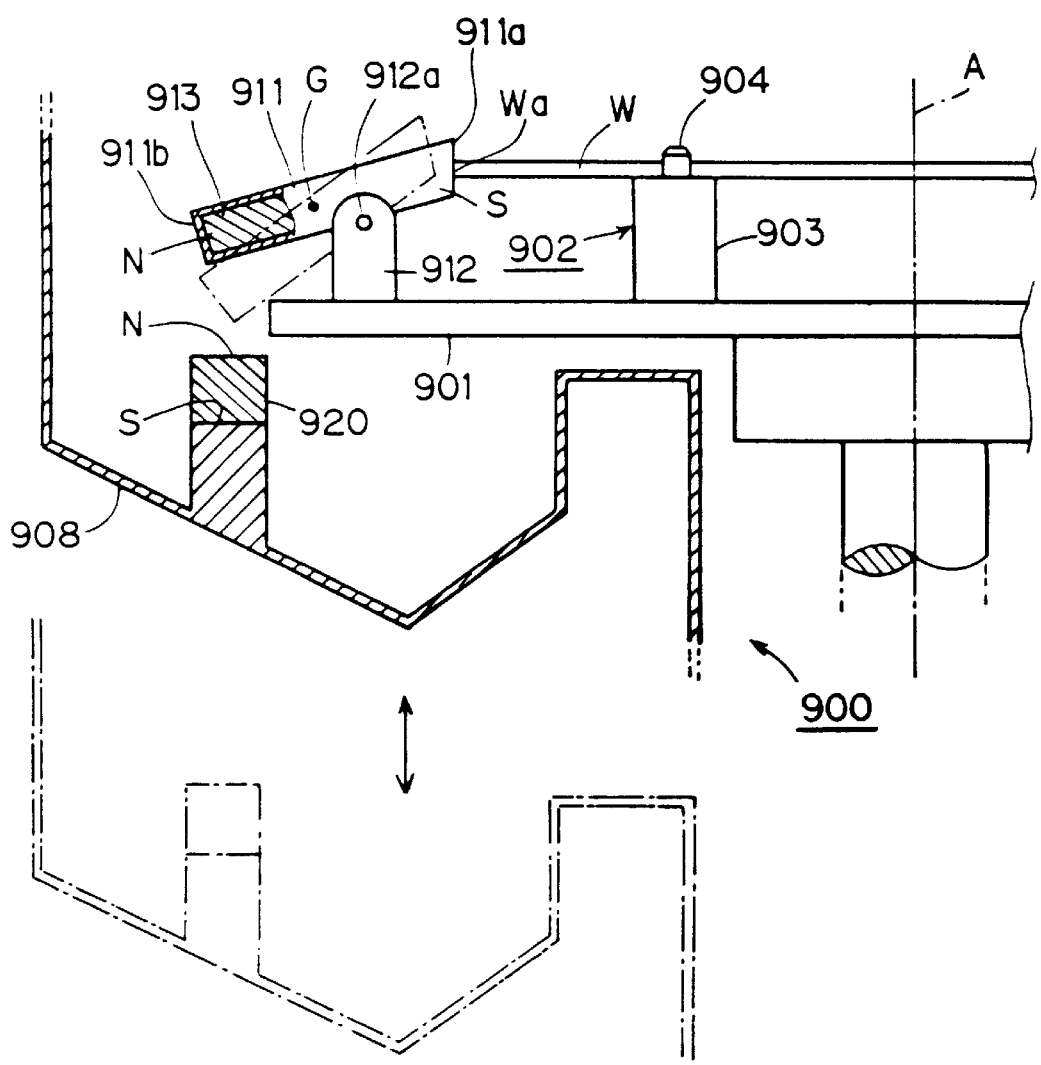
FIG. 18 is a view showing a conventional substrate holding apparatus.

FIGS. 17A and 17B are a plan view and a partial cross sectional view, respectively, of a transportation arm of other substrate transporting apparatus 500A to which the substrate holding apparatus according to the present invention is applied.

The transportation arm 510 of the substrate transporting apparatus 500A includes two fixed holding members 520 and one slidable holding member 580. The slidable holding member 580 is comprised of a column-shaped supporting part 582 and a column-shaped holding part 581 which has a smaller diameter than the supporting part 582. A permanent magnet 550 is attached to the slidable holding member 580 through a supporting shaft 585. The supporting shaft 585 is supported by the transportation arm 510 so as to be freely movable in the diameter direction of the substrate W.

A coil (electromagnet) 595 is fixed below the transportation arm 510 of the substrate transporting apparatus 500A. The coil 595 is electrically connected to a power source unit 590 which is disposed externally. The power source unit 590 is capable of flowing a direct current through the coil 595. Including a change-over switch 591, the power source unit 590 is capable of reversing the current.

In the substrate transporting apparatus 500A having such a structure described above, with the change-over switch 591, the direction of a current which flows through coil 595 is changed, and therefore, the direction of a magnetic line of flux which acts upon the permanent magnet 550 is accordingly changed. This allows attracting force or repulsive force to act upon the permanent magnet 550, whereby as in the substrate transporting apparatus 500 of the second preferred embodiment, the slidable holding member 580 holds and releases the substrate W.

Thus, in the substrate transporting apparatus 500A described above, since magnetic force rather than gravity is utilized even during release of a substrate, even with the substrate inclined at an angle, it is possible to hold and release the substrate by means of a simple structure.

In the substrate transporting apparatus 500A described above, an electromagnet may be attached to the slidable holding member 580 and a permanent magnet may be fixed to the transportation arm 510.

While the invention has been described in detail, the foregoing description is in all aspects illustrative and not restrictive. It is understood that numerous other modifications and variations can be devised without departing from the scope of the invention.

We claim:

1. An apparatus for holding a substrate, which is used in a unit for processing said substrate by rotating said substrate, said apparatus comprising:
   a) a rotational stage for rotating around a first axis;
   b) fixed holding means for restricting a position of said substrate by being in contact with an edge of said substrate, said fixed holding means being fixed on said rotational stage;
   c) movable holding means for holding said substrate, said movable holding means being movably supported on said rotational stage and connected with first magnetic means;
   d) second magnetic means for generating a magnetic field and applying said magnetic field to said first magnetic means, said second magnetic means being arranged outside of said rotational stage; and
   e) inversion means for inverting direction of said magnetic field at said first magnetic means;
   wherein said movable holding means is capable of holding said substrate in contact with said edge of said substrate and releasing said substrate in response to inversion of said direction of said magnetic field.

2. The apparatus of claim 1, wherein
said second magnetic means comprises
   d-1) a circular magnet whose center is on said first axis, and
said inversion means comprises
   e-1) moving means for moving said circular magnet along said first axis, said moving means being capable of inverting said direction of said magnetic field in response to movement of said circular magnet across a predetermined line which is determined in connection with a relative position between said first magnetic means and said circular magnet.

3. The apparatus of claim 2, wherein
said movable holding means comprises a rotatable holding member including
   c-1) a rotatable base provided on said rotational stage, said rotatable base being capable of rotating around a second axis with said first magnetic means in response to inversion of said direction of said magnetic field, and
   c-2) a substrate holding member coupled to said rotatable base, said substrate holding member including a convex curved surface which is capable of holding said substrate in contact with said edge of said substrate and releasing said substrate with rotation of said rotatable base.

4. The apparatus of claim 3, wherein
said first magnetic means is capable of rotating around a third axis, and
rotation of said first magnetic means is transmitted to said rotatable base through transmission means.

5. The apparatus of claim 4, wherein
said transmission means comprises a gear train provided in said rotational stage.

6. The apparatus of claim 4, wherein
said transmission means comprises a belt transmission.

7. The apparatus of claim 4, wherein
said transmission means comprises a link.

8. The apparatus of claim 2, wherein
said movable holding means comprises a slide holding member including
   c-1) a slide base provided on said rotational stage and capable of moving along radially of said rotational stage with movement of said first magnetic means in response to inversion of said direction of said magnetic field, and
   c-2) a substrate holding member provided on said slide base and capable of holding said substrate in contact with said edge of said substrate and releasing said substrate in response to movement of said slide base.

9. An apparatus for holding a substrate, which is used in a transfer unit for transferring said substrate among predetermined substrate processing units, said apparatus comprising:
   a) a transfer arm for transferring said substrate;
   b) fixed holding means for restricting a position of said substrate being in contact with an edge of said substrate, said fixed holding means being fixed on said transfer arm;
   c) movable holding means for holding said substrate, said movable holding means being movably supported on said transfer arm and comprising first magnetic means;
   d) second magnetic means for generating a magnetic field and applying said magnetic field to said first magnetic means; and
   e) inversion means for inverting direction of said magnetic field at said first magnetic means;
   wherein said movable holding means is capable of holding said substrate in contact with said edge of said substrate and releasing said substrate in response to inversion of said direction of said magnetic field.

10. The apparatus of claim 9, wherein
both said first magnetic means and said second magnetic means are permanent magnets, and
said inversion means comprises
   e-1) moving means for moving said second magnetic means, said moving means being capable of inverting said direction of said magnetic field in response to movement of said second magnetic means across a predetermined line which is determined in connection with a relative position between said first magnetic means and said second magnetic means.

11. The apparatus of claim 9, wherein
one of said first magnetic means and said second magnetic means is a permanent magnet and the other is an electromagnet, and said inversion means comprises current inversion means for inverting said direction of said magnetic field by reversing electric current flowing in said electromagnet.

12. An apparatus for holding a substrate, which is used in a unit for processing said substrate by rotating said substrate, said apparatus comprising:
   a) a rotational stage for rotating around a first axis;
   b) a fixed holder restricting a position of said substrate by being in contact with an edge of said substrate, said fixed holder being fixed on said rotational stage;
   c) a movable holder holding said substrate, said movable holder being movably supported on said rotational stage and connected with a first magnetic device;
   d) a second magnetic device generating a magnetic field and applying said magnetic field to said first magnetic device, said second magnetic device being arranged outside of said rotational stage; and
   e) an inversion device inverting direction of said magnetic field at said first magnetic device;
wherein said movable holder is capable of holding said substrate in contact with said edge of said substrate and releasing said substrate in response to inversion of said direction of said magnetic field.

13. The apparatus of claim 12, wherein
said second magnetic device comprises
   d-1) a circular magnet whose center is on said first axis, and
said inversion device comprises
   e-1) a moving device moving said circular magnet along said first axis, said moving device being capable of inverting said direction of said magnetic field in response to movement of said circular magnet across a predetermined line which is determined in connection with a relative position between said first magnetic means and said circular magnet.

14. The apparatus of claim 13, wherein
said movable holder comprises a rotatable holding member including
   c-1) a rotatable base provided on said rotational stage, said rotatable base being capable of rotating around a second axis with said first magnetic device in response to inversion of said direction of said magnetic field, and
   c-2) a substrate holding member coupled to said rotatable base, said substrate holding member including a convex curved surface which is capable of holding said substrate in contact with said edge of said substrate and releasing said substrate with rotation of said rotatable base.

15. The apparatus of claim 14, wherein
said first magnetic device is capable of rotating around a third axis, and
rotation of said first magnetic device is transmitted to said rotatable base through a transmission mechanism.

16. The apparatus of claim 15, wherein
said transmission mechanism comprises a gear train provided in said rotational stage.

17. The apparatus of claim 15, wherein
said transmission mechanism comprises a belt transmission.

18. The apparatus of claim 15, wherein
said transmission mechanism comprises a link.

19. The apparatus of claim 13, wherein
said movable holder comprises a slide holding member including
   c-1) a slide base provided on said rotational stage and capable of moving along radially of said rotational stage with movement of said first magnetic device in response to inversion of said direction of said magnetic field, and
   c-2) a substrate holding member provided on said slide base and capable of holding said substrate in contact with said edge of said substrate and releasing said substrate in response to movement of said slide base.

20. An apparatus for holding a substrate, which is used in a transfer unit for transferring said substrate among predetermined substrate processing units, said apparatus comprising:
   a) a transfer arm for transferring said substrate;
   b) a fixed holder restricting a position of said substrate by being in contact with an edge of said substrate, said fixed holder being fixed on said transfer arm;
   c) a movable holder holding said substrate, said movable holder being movably supported on said transfer arm and comprising a first magnetic device;
   d) a second magnetic device generating a magnetic field and applying said magnetic field to said first magnetic device; and
   e) an inversion device inverting direction of said magnetic field at said first magnetic device;
wherein said movable holder is capable of holding said substrate in contact with said edge of said substrate and releasing said substrate in response to inversion of said direction of said magnetic field.

21. The apparatus of claim 20, wherein
both said first magnetic device and said second magnetic device are permanent magnets, and
said inversion device comprises
   e-1) a moving device moving said second magnetic device, said moving device being capable of inverting said direction of said magnetic field in response to movement of said second magnetic device across a predetermined line which is determined in connection with a relative position between said first magnetic device and said second magnetic device.

22. The apparatus of claim 20, wherein
one of said first magnetic device and said second magnetic device is a permanent magnet and the other is an electromagnet, and
said inversion device comprises a current inverter inverting said direction of said magnetic field by reversing electric current flowing in said electromagnet.

* * * * *